United States Patent [19]

Schilling et al.

[11] Patent Number: 4,849,976

[45] Date of Patent: Jul. 18, 1989

[54] PASM AND TASM FORWARD ERROR CORRECTION AND DETECTION CODE METHOD AND APPARATUS

[75] Inventors: Donald L. Schilling, Sands Point; David Manela, Kew Garden, both of N.Y.

[73] Assignee: SCS Telecom, Inc., Port Washington, N.Y.

[21] Appl. No.: 80,767

[22] Filed: Aug. 3, 1987

[51] Int. Cl.$^4$ .................................................. G06F 11/10
[52] U.S. Cl. ...................................................... 371/39
[58] Field of Search ..................... 371/37, 38, 39, 40, 371/41, 42, 50, 51, 35, 43

[56] References Cited

U.S. PATENT DOCUMENTS

| | | | |
|---|---|---|---|
| 3,475,724 | 10/1969 | Townsend et al. | 371/37 |
| 3,685,016 | 8/1972 | Eachus | 371/37 |
| 3,891,959 | 6/1975 | Tsuji et al. | 371/43 |
| 4,074,229 | 2/1978 | Prey | 371/51 |
| 4,201,976 | 5/1980 | Patel | 371/50 |
| 4,205,324 | 5/1980 | Patel | 371/50 |
| 4,429,390 | 1/1984 | Sonoda et al. | 371/40 |
| 4,435,807 | 3/1984 | Scott et al. | 371/50 |
| 4,532,629 | 7/1985 | Furuya et al. | 371/38 |
| 4,553,237 | 11/1985 | Nakamura | 371/37 |
| 4,598,403 | 7/1986 | Odaka | 371/40 |
| 4,716,567 | 12/1987 | Ito et al. | 371/40 |
| 4,719,628 | 1/1988 | Ozaki et al. | 371/37 |
| 4,748,628 | 5/1988 | Moriwaki | 371/40 |
| 4,750,178 | 6/1988 | Sako et al. | 371/37 |
| 4,769,819 | 9/1988 | Matsutani et al. | 371/38 |

OTHER PUBLICATIONS

David M. Mandelbaum, "Some Classes of Multiple-Burst Error-Correcting Codes Using Threshold Decoding", *IEEE Transactions on Information Theory*, vol. IT-18, No. 2, Mar., 1972, pp. 285-292.

Joachim Hagenauer, "Rate Compatable Punctured Convolutional Codes", *International Conference on Communication*, 1987, pp. 1033-1036.

Correspondence, IEEE Transaction on Information Theory, Apr., 1967, pp. 305-307.

Richard J. Townsend and Edward J. Weldon, Jr., "Sel-f-Orthogonal Quasi-Cyclic Codes", *IEEE Transactions on Information Theory*, vol. IT-13, No. 2, Apr., 1987, pp. 183-195.

Robert H. Deng and Daniel J. Costello, Jr., "Reliability and Throughput Analysis of a Concatenated Coding Scheme", *IEEE Transaction on Communications*, vol. COM-35, No. 7, Jul., 1987, pp. 698-705.

John P. Robinson and Arthur J. Bernstein, "A Class of Binary Recurrent Codes with Limited Error Propagation", *IEEE Transactions on Information Theory*, vol. IT-13, No. 1, Jan., 1967, pp. 106-113.

Mario Blaum and Patrick G. Farrell, "A Class of Burst Error-Correcting Array Codes", *IEEE Transactions on Information Theory*, vol. IT-32, No. 6, Nov., 1986, pp. 836-839.

(List continued on next page.)

*Primary Examiner*—A. D. Pellinen
*Assistant Examiner*—Geoffrey S. Evans
*Attorney, Agent, or Firm*—David B. Newman, Jr.

[57] ABSTRACT

A PASM and TASM encoding method with the steps of storing a block of a data-bit sequence in a memory, calculating parity-check symbols, and outputting an encoded data bit sequence. The PASM encoding method includes calculating a first set of parity-check symbols from the data-bit sequence along a first set of parity lines, and calculating at least a second set of parity-check symbols from the data symbols and parity-check symbols along a second set of parity lines, wherein each parity line of the second set of parity lines has a path traversing through the parity-check symbols. The TASM encoding method includes calculating a first parity-check symbol from data symbols and parity-check symbols along a first parity line having a first slope and calculating at least a second parity-check symbol from data symbols and parity-check symbols along a second parity line having a second slope, wherein the second parity line traverses through the first parity-check symbol.

15 Claims, 9 Drawing Sheets

OTHER PUBLICATIONS

Lucky, Satz, & Weldon, Jr., "Principles of Data Communications", pp. 375-379.

Shu Lin and Philip S. Yu, "A Hybrid ARQ Scheme with Parity Retransmission for Error Control of Satellite Channels," *IEEE Transactions on Communications Theory*, vol. COM-30, No. 7, Jul., 1982, pp. 1701-1719.

David M. Mandelbaum, "An Adaptive-Feedback Coding Scheme Using Incremental Redundancy," *IEEE Transactions on Information Theory, May, 1974, pp. 388-389.*

L. D. Rudolph, "A Class of Majority Logic Decodable Codes," *IEEE Transactions on Information Theory*, Apr. 1967, pp. 305-307.

Shu Lin, Daniel J. Costello, Jr. and Michael J. Miller, "Automatic Repeat-Request Control Scheme," IEEE Communications Magazine, vol. 22, No. 12, Dec. 1984, pp. 5-17.

Fig. 2A

| $a_1$ | $a_2$ | $a_3$ | · · · | $a_h$ |
|---|---|---|---|---|
| $a_{h+1}$ | $a_{h+2}$ | $a_{h+3}$ | · · · | $a_{2h}$ |
| · | · | · | | · |
| · | · | · | | · |
| · | · | · | | · |
| $a_{(g-1)h+1}$ | $a_{(g-1)h+2}$ | $a_{(g-1)h+3}$ | · · · | $a_{gh}$ |

Fig. 2B

| $a_1$ | $a_{g+1}$ | $a_{2g+1}$ | · · · | $a_{(h-1)g+1}$ |
|---|---|---|---|---|
| $a_2$ | $a_{g+2}$ | $a_{2g+2}$ | · · · | $a_{(h-1)g+2}$ |
| · | · | · | | · |
| · | · | · | | · |
| · | · | · | | · |
| $a_g$ | $a_{2g}$ | $a_{3g}$ | · · · | $a_{gh}$ |

Fig. 4A

| ROW | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 |
|---|---|---|---|---|---|---|---|---|---|---|---|---|---|---|---|---|---|---|---|---|---|---|---|---|
| 1 | | | | | | | | | | | | | | | | | | | | | | 0 | 1 | 0 |
| 2 | | | | | | | | | | | | | | | | | | | | | 0 | 1 | 1 | 0 |
| 3 | | | | | | | | | | | | | | | | | | | | 0 | 0 | 1 | 1 | 0 |
| 4 VERTICAL | | | | | | | | | | | | | | | | | 0 | 1 | 1 | 0 | 1 | 1 | 0 | 0 |
| 5  1/4 | 0 | 1 | 0 | 1 | 0 | 1 | 1 | 0 | 0 | 0 | 1 | 1 | 0 | 1 | 1 | 0 | 1 | 1 | 0 | | | | | |

Fig. 4B (similar matrix with circled 1's indicating bits)

Fig. 4C

INVERT THESE BITS 1 2 ③
1 2 3
1 ③ 2 2
2 ③ 3 1
1 1
1

Fig. 5A

|    | 13 | 12 | 11 | 10 | 9 | 8 | 7 | 6 | 5 | 4 | 3 | 2 | 1 |   |
|----|----|----|----|----|---|---|---|---|---|---|---|---|---|---|
|    |    |    |    |    |   |   |   |   | 0 | 0 | 0 | 0 | 1 | 1 |
|    |    |    |    |    |   |   |   |   | 0 | 0 | 0 | 0 | 1 | 2 |
|    |    |    |    |    |   |   |   |   | 0 | 0 | 0 | 0 | ① | 3 |
|    |    |    |    |    |   |   |   | 0 | 0 | 1 | ① | ① | 0 | 4 SLOPE 1 |
|    |    |    |    |    |   | 0 | 1 | 1 | 1 | 0 | 1 | 0 |   | 5 SLOPE 1/2 |
| 1  | 0  | 0  | 0  | 1  | 0 | 0 | 0 | 0 | 0 | 1 | 0 | 0 |   | 6 SLOPE 1/4 |

Fig. 5B

|     | 6 | 5 | 4 | 3 | 2 | 1 |   |
|-----|---|---|---|---|---|---|---|
|     |   |   |   |   |   | 1 | 1 |
|     |   |   |   |   |   |   | 2 |
|     |   |   |   |   | 2 |   | 3 |
|     |   |   |   | 2 |   |   | 4 |
|     |   |   |   |   |   |   | 5 |
|     |   |   |   |   |   |   | 6 |

PASM AND TASM FORWARD ERROR CORRECTION AND DETECTION CODE METHOD AND APPARATUS

BACKGROUND OF THE INVENTION

This invention relates to forward error correction and detection codes, and more particularly to a forward error correction and detection code method and apparatus having parity check bits (or symbols) added to information bits (or symbols) to form a codeword.

RELATED PATENTS

This patent is related to the following patent applications: Donald L. Schilling and David Manela, "Schilling-Manela Forward Error Correction and Detection Code Method and Apparatus," Ser. No. 07/032,011, filed Mar. 30, 1987, now U.S. Pat. No. 4,796,260; Donald L. Schilling and David Manela, "SM Codec Method and Apparatus," Ser. No. 07/122,948, filed Nov. 19, 1987; and, Donald L. Schilling and David Manela, "PASM and TASM Forward Error Correction and Detection Code Method and Apparatus," Ser. No. 07/119,932, filed Nov. 13, 1987.

DESCRIPTION OF THE PRIOR ART

A forward error correction (FEC) or detection code has r bits, called parity check bits, added to k information data bits to form an $n = k + r$ bit codeword. The r parity-check bits are added in such a way as to allow a specified number of errors to be detected and/or corrected. The algorithm employed to generate the r parity-check bits for given information bits differs for each code.

Specific forward error correction and detection codes which are well known in the prior art include the Reed-Solomon code, the Golay code, error correcting/detecting codes using the Hadamard matrix, the BCH code and the Hamming code. Each of these codes employs a different algorithm for generating the parity check bits and a different algorithm for recovering the original k data bits or for detecting errors. Texts describing such prior art codes include: H. Taub and D. L. Schilling, *Principles of Communication Systems*, 2 Ed., McGraw-Hill Book Company (1986); S. Lin and D. J. Costello, Jr., *Error Control Coding: Fundamentals and Applications*, Prentice-Hall, Inc., (1983); and R. G. Gallager, *Information Theory and Reliable Communications*, John Wiley and Sons, Inc., (1968).

The forward error correction and detection codes are characterized by their algorithm for encoding and decoding and also by several other properties:

1. Code rate, R: The code rate is the ratio of information data bits, k, to the sum, n, of information data bits and parity check bits, r. Thus, the number of bits in a codeword is $n = k + r$ and the code rate $R = k/n$.
2. Hamming distance: The minimum number of bits by which codewords differ is called the Hamming distance, d. If there are k information bits in an uncoded word, there are $2^k$ possible uncoded information words. For example, if $k = 4$ there are 16 possible uncoded words: 0000, ..., 1111. An error in any bit will make the word look like a different one of the $2^k$ words and therefore an error cannot be detected or corrected. However, if r parity check bits are added to the k-bit uncoded word, an n-bit codeword is formed. Hence, there are $2^n$ possible words of which only $2^k$ are used. The selection of the codewords so as to ensure a maximum separation between the codewords is what makes a good code. For example, a Hamming code containing $k = 4$ information bits and $n = 7$ coded bits has $2^4 = 16$ codewords of a possible $2^7 = 128$ words. This is called a (n,k) or (7,4) code of rate $R = 4/7$. These codewords are selected so that each codeword differs by 3 bits. Thus, a single error can be detected and corrected while two errors on a codeword cannot be corrected. In the above example, $d = 3$.
3. Error Detection: In general, codes can detect $d - 1$ errors in a codeword.
4. Error Correction: In general, a code can correct t errors in a codeword, where $$t \leq \frac{d_{min} - 1}{2} \text{ or } \frac{d_{min}}{2} - 1, \quad (1)$$

depending on whether d is odd or even, respectively. An approximate upper bound on the number of errors, t, that a code can correct is $$t \leq \frac{r}{4} + \frac{1}{2} \quad (2)$$

5. Erasures: Side information can be used to ascertain that specific bit(s) in a codeword had an increased probability of error. On such occasions those bits can be erased, replacing them by an X rather than by a 1 or 0 in the decoding algorithm. The number of erasures that a code can correct in a codeword is $$E \leq d - 1 \quad (3)$$

If errors and erasures can both occur in a codeword $$d > E + 2t \quad (4)$$

For example, if $d = 8$, and there are 1 erasure and 2 errors present, the decoded word will be corrected.

6. Burst Codes: Some codes are designed so that errors can be efficiently corrected if they occur randomly, while other codes are designed so that they can correct a burst, or cluster, of bits where each bit may be in error with high probability. Such codes are called burst correction codes and can correct bursts of length B bits provided that an error-free gap of G bits occurs between bursts. The Reiger bound states that $$G/B \geq \frac{1 + R}{1 - R} \quad (5)$$

The Reed-Solomon code is an example of a burst correcting code capable of correcting either errors or erasures.

7. Concatenation: Concatenation is encoding data using one code and then the encoded data again is encoded using a second code. A reason for using concatenation is that one code can correct random errors and when failing will generate a burst of errors which the second code can correct. A convolutional code frequently is concatenated with a Reed-Solomon code.

OBJECTS AND SUMMARY OF THE INVENTION

An object of the present invention is to provide a forward error correction (FEC) and detection code method and apparatus.

Another object of the present invention is to provide an FEC and detection code method and apparatus that is very efficient for burst error detection and correction.

A further object of the present invention is to provide an FEC and detection code for operating in an ARQ system using efficient code combining.

A still further object of the present invention is to provide an FEC and detection code capable of correcting errors and/or erasures.

A further object of the present invention is to provide an FEC and detection code method and apparatus that is easier to implement than many prior art codes.

An additional object of the present invention is to provide an FEC and detection code method and apparatus that is more powerful and less complex than many prior art codes.

According to the present invention, as embodied and broadly described herein, a PASM error detecting and correcting code encoding method is provided comprising the steps of storing a block of a data-symbol sequence having data symbols with p-bits per symbol in memory means, and calculating parity-check symbols with p-bits per symbol. The memory means includes information-memory cells for storing the data symbols, and parity-check memory cells for storing the parity-check symbols. A first set of parity-check symbols are calculated from the data symbols along a first set of parity lines, wherein each parity line of the first set of parity lines has a path with a first slope traversing through the information-memory cells. At least a second set of parity-check symbols are calculated from the data symbols and parity-check symbols along a second set of parity lines, wherein each parity line of the second set of parity lines has a path with a second slope traversing through the information-memory cells and through the parity-check memory cells. The steps further include outputting an encoded-data-symbol sequence comprising the data symbols and the parity-check symbols.

The step of calculating a first set of parity-check symbols from the data symbols along a first set of parity lines includes setting the parity-check symbol for each of the first set of parity-check symbols for each parity line equal to the modulo $2^p$ sum of the data symbols along each parity line. The first set of parity-check symbols forms a first parity row located in the parity-check memory cells. The step of calculating at least a second set of parity-check symbols from the data symbols and parity-check symbols along a second set of parity lines includes setting the parity-check symbol for each of the second set of parity-check symbols for each parity line equal to the modulo $2^p$ sum of the data symbols and parity-check symbols along each parity line. The second set of parity-check symbols forms a second parity row located in the parity-check memory cells. The step of outputting an encoded-data-symbol sequence comprising the data symbols and the parity-check symbols, is for transmitting data over a communications channel.

The step of storing a block of a data-symbol sequence in memory means can include memory means having g rows by h columns of information-memory cells, and r rows of parity-check memory cells. Each of the first set of parity lines can have a straight diagonal path with a first slope through the g rows by h columns of the information-memory cells and each of the second set of parity lines can have a straight diagonal path with a second slope through the g rows by h columns of the information-memory cells and through the first parity row of the parity-check memory cells.

The PASM error detecting and correcting encoding method additionally can include the step of calculating at least a third set of parity-check symbols from the data symbols and parity-check symbols along a third set of parity lines, by setting the parity-check symbol for each of the third set of parity-check symbols for each parity line equal to the modulo $2^p$ sum of the data symbols and parity-check symbols along each parity line. Each parity line of the third set of parity lines has a path with a third slope traversing through the information-memory cells and through the first and second parity rows, and the third set of parity-check symbols forms a third parity row located in the parity-check memory cells.

The present invention also includes a TASM error correcting and detecting code encoding method comprising the steps of storing a block of a data-symbol sequence having data symbols with p-bits per symbol in memory means, and calculating parity-check symbols. The memory means includes information memory cells for storing data symbols, and parity-check memory cells for storing parity-check symbols. A first parity-check symbol is calculated from data symbols and parity-check symbols located in the information memory cells and parity-check memory cells, respectively, along a first parity path having a first slope passing through the information memory cells nd parity-check memory cells. A second parity-check symbol is calculated from data symbols and parity-check symbols located in the information memory cells and parity-check memory cells, respectively, along a second parity path having a second slope passing through the information memory cells and parity-check memory cells. The second parity path traverses through the first parity-check symbol. Thus, the second parity-check symbol is located with reference to the first parity-check symbol, in the second parity row located in the parity-check memory cells. The steps can further include outputting an encoded-data-symbol sequence comprising the data-symbols and the parity-check symbols.

The step of calculating the first parity-check symbol from data symbols and parity-check symbols located in the information memory cells and parity-check memory cells, respectively, includes adding modulo $2^p$ the data symbols and parity-check symbols along the first parity path. The first parity-check symbol is then stored in a first parity row located in the parity-check memory cells. The step of calculating at least a second parity-check symbol from data symbols and parity-check symbols located in the information memory cells and parity-check memory cells includes the step of adding modulo $2^p$ the data symbols and parity-check symbols along the second parity path, wherein the second parity-check symbol is located and stored at the second slope with reference to each of the first parity-check symbols, respectively, in a second parity row located in the parity-check memory cells.

The TASM error detecting and correcting encoding method additionally can include the step of calculating at least a third parity-check symbol from data symbols and parity-check symbols located in the information memory cells and parity-check memory cells, respectively, along a third parity path having a third slope passing through the information memory cells and parity-check memory cells, by adding modulo $2^p$ the data symbols and parity-check symbols along the third parity path. The third parity path traverses through the second parity-check symbol. Thus, the third parity-check symbol is located at the third slope with reference to the second parity-check symbol, in the third parity row located in the parity-check memory cells.

The present invention further includes an apparatus for encoding a PASM forward error correcting and detecting code, comprising memory means coupled to a data source for storing a block of a data-symbol sequence, and processor means coupled to the memory means for calculating parity-check symbols. The processor means may be embodied as a processor. The processor calculates a first set of parity-check symbols from the data symbols along a first set of parity lines. The first set of parity-check symbols forms a first parity row located in the parity-check memory cells. The processor means further calculates at least a second set of parity-check symbols from the data symbols along a second set of parity lines. The second parity-check symbol forms a second parity row located in the parity-check memory cells. The processor means further outputs an encoded-data-symbol sequence comprising the data-symbol sequence and the parity-check symbols.

The present invention also includes a TASM error correcting and detecting code encoding apparatus comprising memory means coupled to a data source for storing a block of a data-symbol sequence, and processor means. The memory means includes information memory cells and parity-check memory cells. The processor means calculates a first parity-check symbol from data symbols located in the information memory cells, along a first parity path; and stores the first set of parity-check symbols in a first parity row. The processor means further calculates at least a second parity-check symbol from data symbols and parity-check symbols, along a second parity path having a second slope by adding modulo $2^p$ the data symbols and parity-check symbols along the second parity path. The second parity path traverses through the first parity-check symbol. The processor means stores the second parity-check symbol in the second parity row, and outputs an encoded-data-symbol sequence comprising the data-symbol sequence and the parity-check sequence.

Without departing from the spirit or scope of the present invention, the method and apparatus of the present invention may include having the data-symbol sequence blocked and stored in a λ-dimensional memory. In this more general case, there would be sufficient rows and columns to correspond to the λ-dimensional system. Further, parity-check symbols can be calculated from data symbols and parity-check symbols, along parity lines having curved paths passing through the λ-dimensional system.

Additional objects and advantages of the invention will be set forth in part in the description which follows, and in part will be obvious from the description, or may be learned by practice of the invention.

BRIEF DESCRIPTION OF THE DRAWINGS

The accompanying drawings, which are incorporated in and constitute a part of this specification, illustrate a preferred embodiment of the invention, and together with the description, serve to explain the principles of the invention.

FIG. 2A shows a g×h block of data in which the data was entered row by row;

FIG. 2B shows a g×h block of data in which the data was entered column by column;

FIG. 4A shows a data graph having data bits with three rows of parity-check bits encoded using the PASM code;

FIG. 4B illustrates a received codeword with errors;

FIG. 4C shows a composite-error graph;

FIG. 5A illustrates a data graph showing three errors;

FIG. 5B illustrates the corresponding error graph for FIG. 5A;

DETAILED DESCRIPTION OF THE PREFERRED EMBODIMENTS

Reference will now be made to the present preferred embodiments of the invention, examples of which are illustrated in the accompanying drawings.

PASM Encoder

Figure 1:
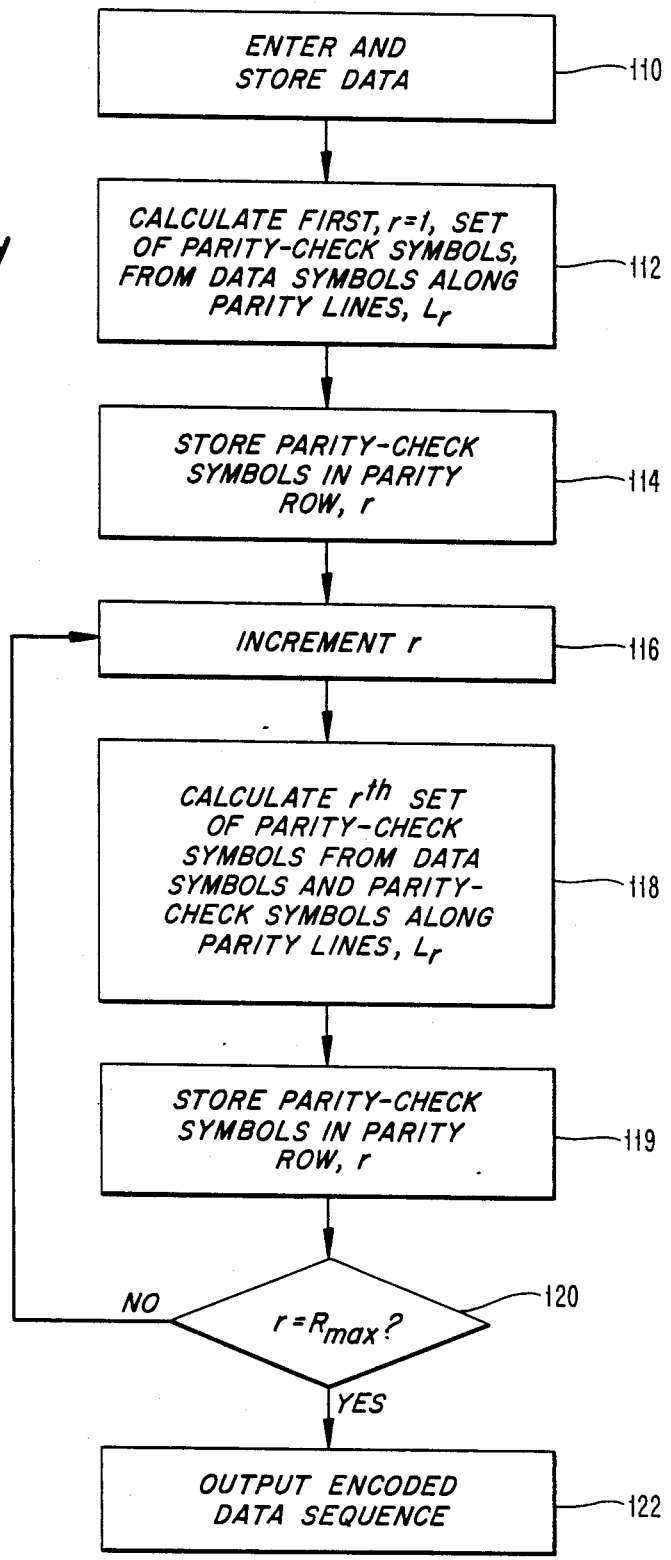
FIG. 1 shows a flow diagram of a PASM encoding method according to be present invention.

Referring to FIG. 1, a preferred embodiment of a Partial-Autoconcatenated-Schilling-Manela (PASM) error correcting and detecting code encoding method is shown comprising the steps of entering and storing 110 a block of a data-bit sequence having data symbols with p-bits per symbol, in memory means. The memory means has g rows by h columns of information-memory cells for storing the data symbols, and $R_{max}$ rows of parity-check memory cells for storing parity-check symbols. The memory means may be embodied as a memory including a random access memory, or any other memory wherein data readily may be accessed. The method includes calculating 112 a first (r=1) set of parity-check symbols from the data symbols along a first set of parity lines having slope $L_r$, wherein each set of the first set of parity lines has a path traversing through the information memory cells. More generally, the parity lines may be parity paths traversing through the information memory cells. The parity-check symbols Si are stored 114 in the first (r=1) parity row of the parity-memory cells. The method increments 116 a counter to the next number, (r+1), of the set of the parity-check symbols, and proceeds to calculate the (r+1)$^{th}$ set of parity-check symbols. In the step of calculating the (r+1)$^{th}$ set of parity-check symbols, the parity-check symbols are calculated from data symbols and parity-check symbols along the parity lines having slope $L_r$. During this and subsequent steps, the parity-check symbols are checking parity for data symbols and parity-check symbols along the parity line. The method determines 120 whether all the sets of parity-check symbols, which corresponds to the number of parity rows, $R_{max}$, have been calculated, and outputs 122 an encoded-data-symbol sequence comprising the data symbols and the parity-check symbols if all sets have been calculated. If all the sets of parity-check symbols have not been calculated, then the process increments 116 and calculates the next set of parity symbols from data symbols and parity-check symbols along the next corresponding set of parity lines.

In a particular embodiment of the PASM encoding method according to the present invention, the parity-check symbols may be parity-check bits, and the data symbols may be data bits. In this embodiment, the method may comprise calculating parity-check bits from data bits, along a first set of parity lines. Each of the first set of parity lines can have a straight diagonal path with a first slope through the g rows by h columns of the information-memory cells. The parity-check bits are then stored in the first parity row. Subsequently, each of the second set of parity lines can have a straight diagonal path with a second slope through the g rows by h columns of the information memory cells, and through the first parity row. Alternatively, each of the first and second set of parity lines can have curved paths through the g rows by h columns of the information-memory cells. The parity-check bits are calculated by adding modulo 2 the data bits along each of the parity lines, and setting the parity check bit for each parity line equal to the modulo 2 sum of the data bits and parity-check bits along each parity line, respectively. Accordingly, the parity-check bits are stored in the $R_{max}$ rows of the parity-memory cells of the memory.

The information data bits are first collected by the encoder to form a g row by h column block of data in the information memory cells, as shown in FIGS. 2A and 2B. Note, that the data can be entered into the encoder row-by-row, as illustrated in FIG. 2A, or column-by-column, as illustrated in FIG. 2B. After the block of data is entered into the encoder, parity-check bits are added. To illustrate the algorithm for adding parity-check bits consider that the first h parity-check bits, $S_{1,i}$, are obtained by modulo 2 adding a column of data-bits and setting the parity-check bit so that the parity-check bit is equal to the modulo 2 sum of the data bits. Thus, in FIG. 2B, for the $i^{th}$ column, the first parity-check bit is $$S_{1,i} = \sum_{j=1}^{g} a_{ig+j} \mod 2 \tag{6}$$

where $i = 1, 2, \ldots, h-1$

Let us further assume that the second set of parity-check bits are formed by modulo 2 adding the data bits and parity-check bits along a 45° diagonal (slope = +1). Thus, in FIG. 2B, $$S_{2,i} = \sum_{j=1}^{g+r} a_{(i+j+1)g-(j-1)} \oplus S_{1,i+1} \mod 2 \tag{7}$$

where $i = -g+1, \ldots, 0, 1, 2, \ldots, h-1$

Note that a parity row is formed as in the basic Schilling-Manela code, which is described in Schilling and Manela, "Schilling-Manela Forward Error Correction and Detection Code", U.S. Patent Application No. 07/032,011, filed Mar. 26, 1987, and is expressly incorporated herein by reference.

A parity-check symbol is calculated by adding modulo $2^p$ the data symbols and parity-check symbols along a parity line having slope $L_r$. The resultant set of parity-check symbols for that particular set of parity lines having slope $L_r$ is stored in parity row, r. This procedure is repeated using parity lines having slopes $L_r$ until every data symbol and parity-check symbol stored in the memory is intersected by the parity line having slope $L_r$. Accordingly, all of the parity-check symbols calculated from parity lines having slope $L_r$ form a parity row r.

After storing a set of parity-check symbols in parity row r, the slope $L_r$ is incremented to slope $L_{r+1}$ and the process is repeated until $r = R_{max}$. Thus the total number of parity rows formed is $R_{max}$. The composite data block consisting of data symbols and parity-check symbols is then transmitted at will.

Although any slope $L_r$ will result in satisfactory performance, the node distance can be maximized by using slopes $L_r$ which do not yield multiple intersections in the sense described infra.

The selection of slopes $L_r$ is optimized by maximizing the distance of the code. The slopes have been selected correctly if the distance of the code is $d = 2R_{max}$, where $R_{max}$ is the number of parity rows. The code distance is the minimum number of errors that must be made before one codeword looks like another codeword.

Figure 3:
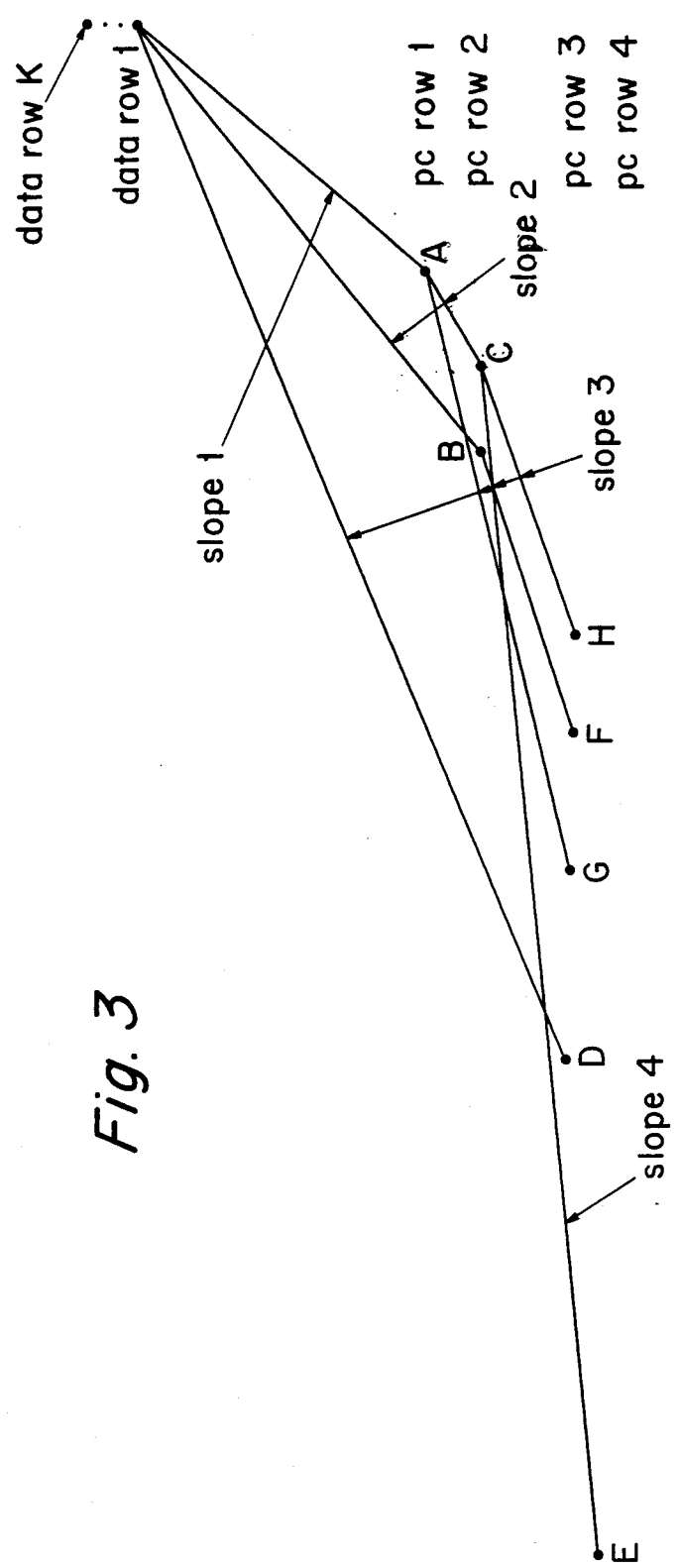
FIG. 3 shows preferred slopes for PASM code.

In FIG. 3 one can see that slope $L_2 <$ slope $L_1$. Also, slope $L_3$ should be chosen so that it is less than the slope of a line passing through cells A and B. Similarly, for slope $L_4$, the performance criteria of having the maximum code distance is guaranteed if slope $L_4$ is less than the slope of a line passing through cells C and D, etc.

It is readily seen that if only three parity rows are used and the slopes $L_1$, $L_2$, and $L_3$ are chosen correctly, then $2^3 = 8$ errors must occur before the errors are non-detectable. One correct choice of slopes is: $L_1 = 1$; $L_2 = \frac{1}{2}$; and, $L_3 = \frac{1}{4}$.

Decoding the PASM code is similar to the decoding of the basic Schilling-Manela code except that a variable threshold exists with the parity-check symbols for the PASM code.

In order to understand why there is a variable threshold with the PASM code, one can see that all data bits are checked by $R_{max}$ rows of parity-check bits. Thus the maximum intersection is $R_{max}$. The threshold $T_D$ is set at the maximum integer such that $T_D \leq R_{max}/2$. The bits in parity row $r = 1$, however, are checked by $R_{max}$ parity rows and therefore the maximum number of intersections possible is $R_{max}$. Hence, the threshold $T_{pc1}$ is the closest integer such that $T_{pc1} \leq R_{max}/2$. Similarly, $T_{pc2} \leq (R_{max} - 1)/2$, etc. Note that errors in parity row $(R_{max} - 1)$ can have two intersections and therefore $T_{pc,R_{max}-1} = 1$. Thus, an error can be detected and corrected. Further, errors in row $R_{max}$ can be detected but not corrected.

As an illustrative example, FIG. 4A shows data bits in rows one, two and three. Parity rows are shown as rows four, five and six. The parity check bits have been calculated using the PASM code. Since $R_{max} = 3$, the data threshold and the threshold of parity row 1 is $T = 1$. FIG. 4B shows the data bits and parity-check bits of FIG. 4A with three errors, in cells (1,2), (2,4), and (3,3). FIG. 4C shows the composite error graph having composite error counts above the threshold. Inverting the bits in these cells corrects the errors.

As a second illustrative example, FIGS. 5A and 5B show a data graph with errors and corresponding error graph, respectively. In this example there are three errors. Since $R_{max}=3$, the data threshold and the threshold of parity row 1 is $T=1$. Two errors are in cells (3,4) and (2,4) which are above the threshold. Inverting the bits in these cells yields an error graph where cell (1,3) shows three intersections. This three error pattern could not be corrected in the basic Schilling-Manela encoder.

According to the present invention, parity-check bits can be formed from different diagonals and the diagonals can have a positive or a negative slope. The spirit of the invention is that any selection of data bits and interim calculated parity-check bits, be it on a straight diagonal line or a curved line can be used to generate new parity check bits. Each such line is called a parity line.

TASM Encoder

Figure 6:
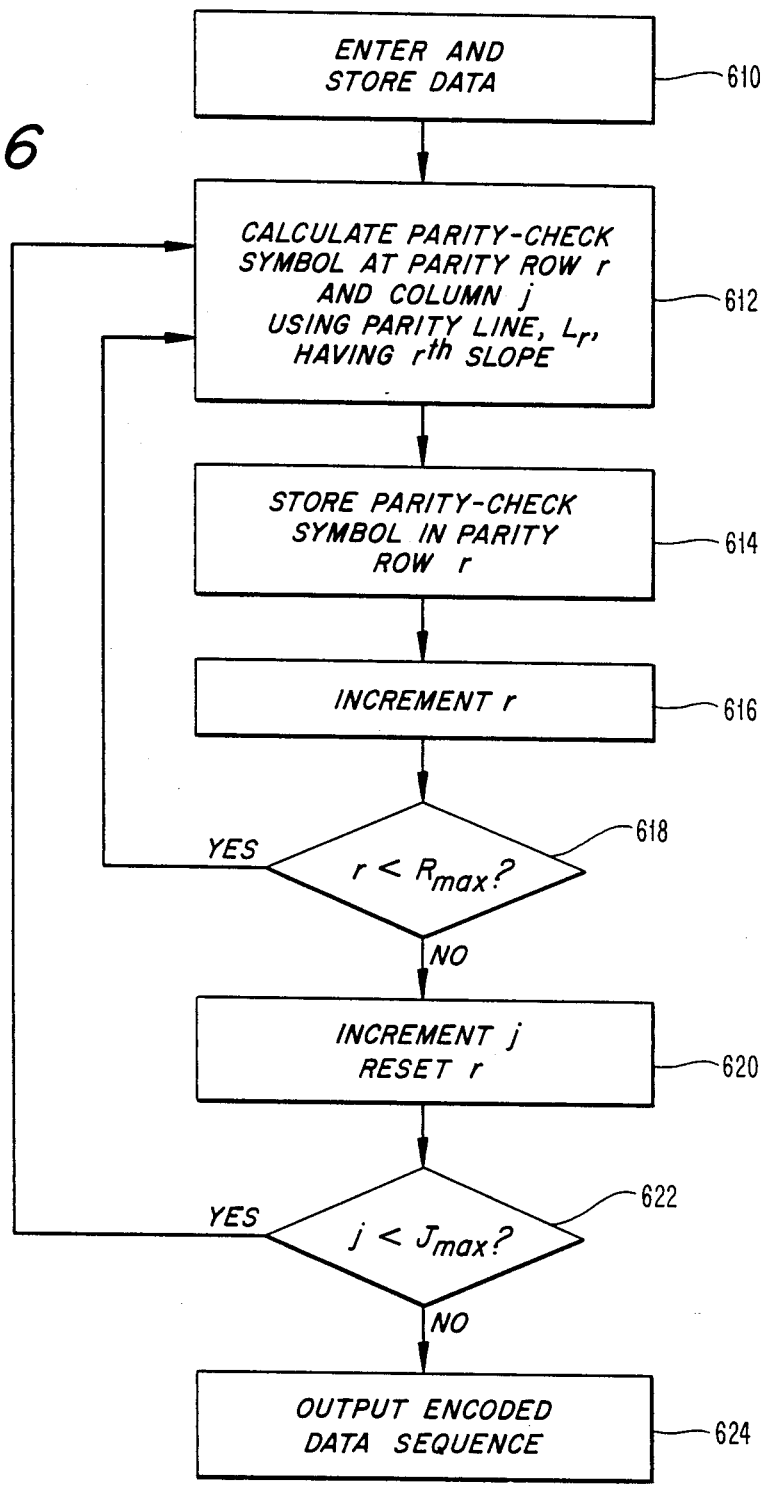
FIG. 6 shows a flow diagram of a TASM encoding method according to the present invention.

Referring to FIG. 6, a preferred embodiment of a Total-Autoconcatenated-Schilling-Manela (TASM) error correcting and detecting code encoding method is shown comprising the steps of entering and storing 610 a block of a data-bit sequence having data symbols with p-bits per symbol, in memory means. The memory means has g rows by h columns of information-memory cells for storing the data symbols, and $R_{max}$ rows of parity-check memory cells for storing parity-check symbols. The memory means may be embodied as a memory including a random access memory, or any other memory wherein data readily may be accessed. The method includes calculating 612 a first parity check symbol from data symbols and parity-check symbols located in the information memory cells and parity-check memory cells, respectively, along a first parity line having a first slope passing through the information memory cells and parity-check memory cells. The parity lines more generally can be considered parity paths through the information memory cells and parity-check memory cells. The first parity-check symbol is stored 614 in a first parity row (r=1). The method includes incrementing 616 a counter and determining 618 whether the count is less than or equal to the maximum number of parity rows ($R_{max}$). In the event the count is less than or equal to $R_{max}$, then the method proceeds to calculate the next parity-check symbol. Accordingly, a second parity-check symbol is calculated 612 from data symbols and parity-check symbols located in the information memory cells and parity-check memory cells, respectively, along a second parity line having a second slope through the information memory cells and parity-check memory cells. The second parity-check symbol is stored 614 in a second parity row. The second parity line traverses through the first parity-check symbol. Thus, the second parity-check symbol is located with reference to the first parity-check symbol, in the second parity row located in the parity-check memory cells.

A third parity-check symbol can be calculated 612 from data symbols and parity-check symbols located in the information memory cells and parity-check memory cells, respectively, along a third parity line having a third slope passing through the information memory cells and parity-check memory cells. The third parity line traverses through the second parity-check symbol. Thus, the third parity-check symbol is located at the third slope with reference to the second parity-check symbol, in the third parity row in the parity-check memory cells.

Parity-check symbols are calculated for all the parity rows. Upon calculating the parity-check symbol for the last parity row, $R_{max}$, the method determines 618 that the parity-check symbol for the last parity row has been calculated and increments 620 a column counter. Accordingly, the method calculates 612 a parity-check-symbol starting, again, with the first parity row, using a parity line having the first slope. Subsequently, parity-check symbols are calculated for the second, third, etc., parity rows, until a set of parity check-symbols are calculated for all parity rows. Each parity-check symbol is calculated using a parity line having a slope corresponding to a particular parity row.

The process of calculating parity-check symbols is repeated until parity-check symbols are calculated for all parity rows and columns. This can be determined using a column counter and determining 622 whether all columns have been used ($J_{max}$). Upon calculating the parity-check symbols for all parity rows and columns, the method outputs 624 an encoded data sequence comprising data symbols and parity-check symbols.

The step of calculating 612 parity-check symbols from data symbols and parity-check symbols located in the information memory cells and parity-check memory cells, respectively, includes adding modulo $2^p$ the data symbols and parity-check symbols along a particular parity line.

Figure 7:
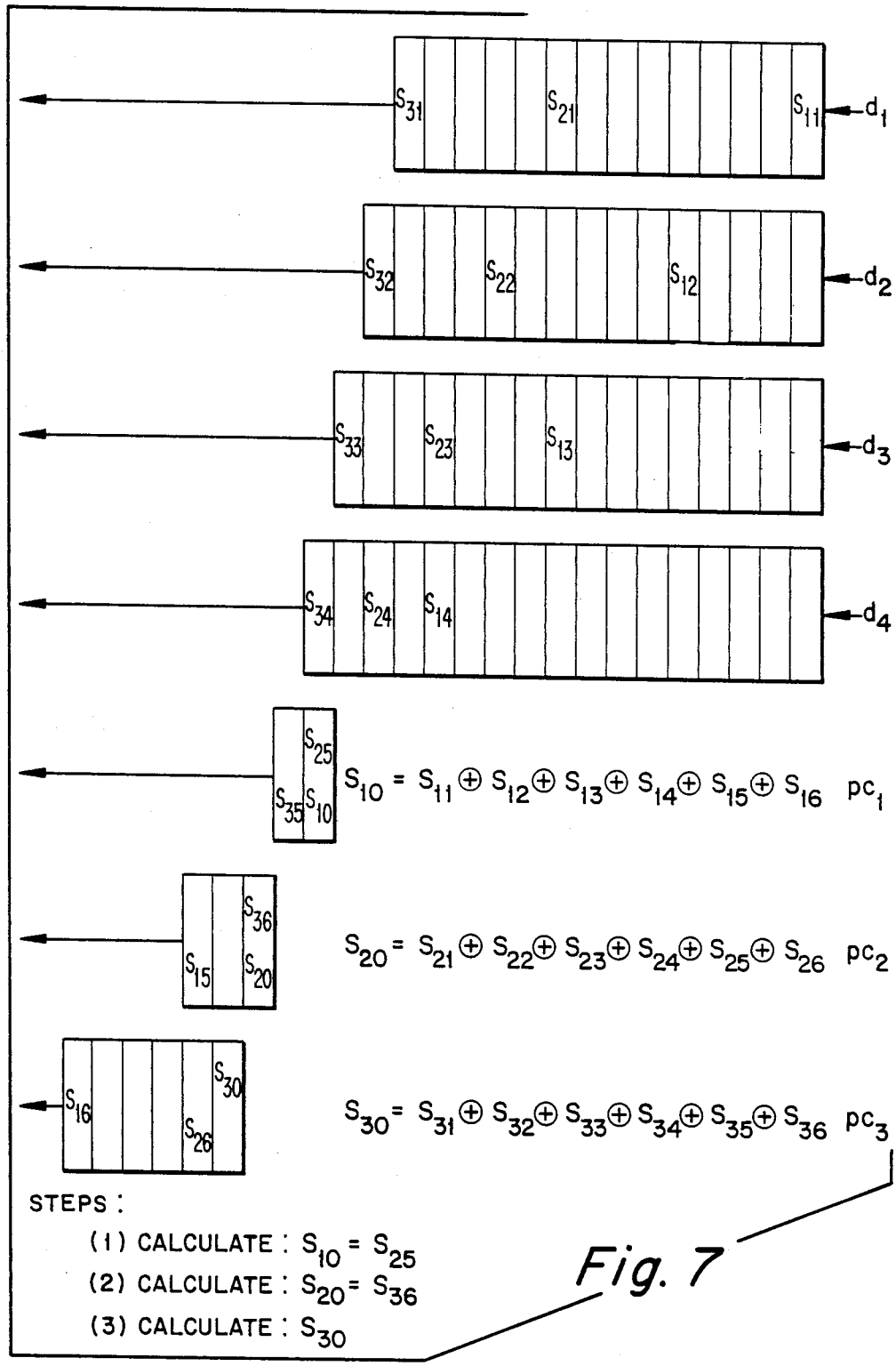
FIG. 7 shows an example of the TASM encoder for a (7,4) code.
Figure 8:
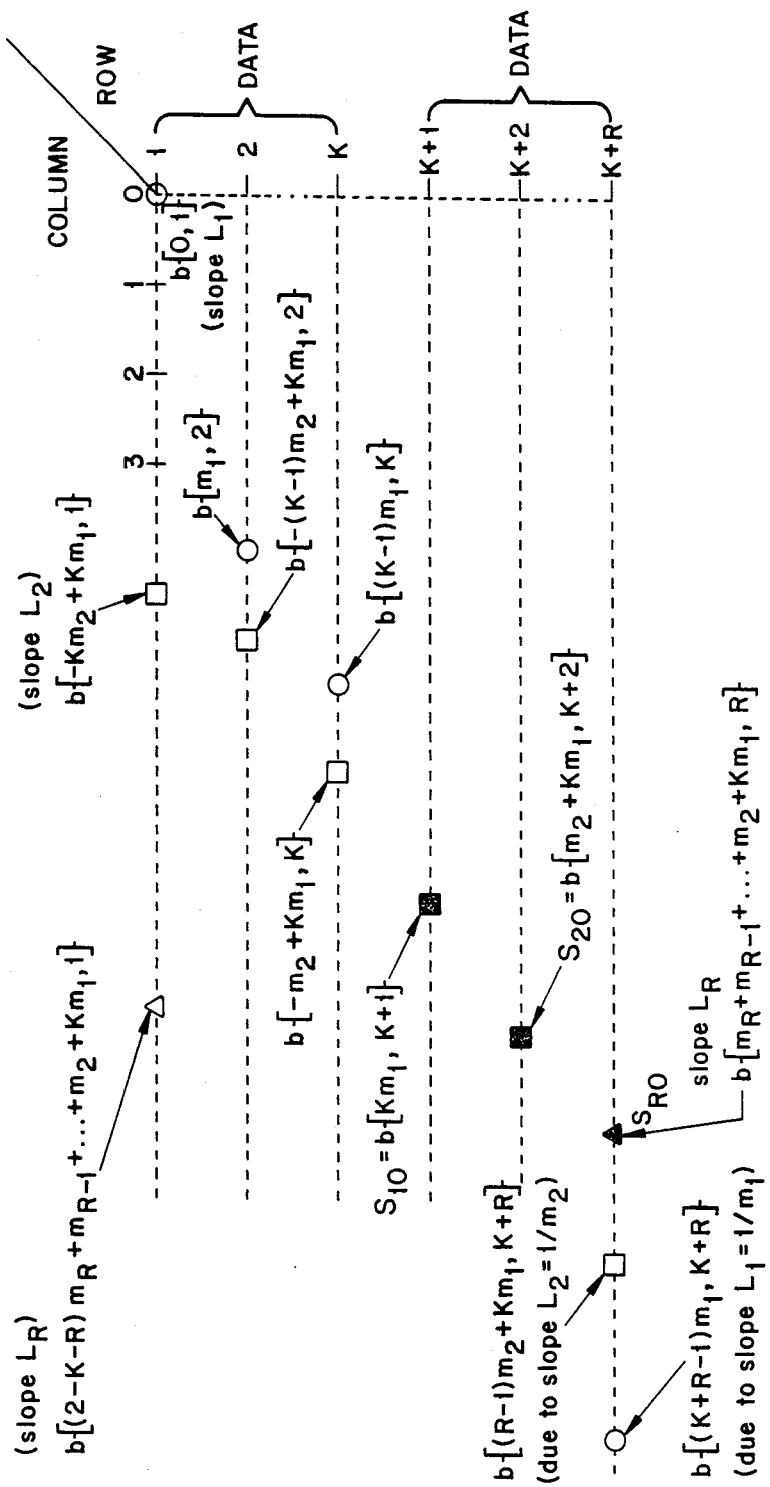
FIG. 8 illustrates the generalized structure of the TASM coder, showing slopes $S_{10}$ and $S_{20}$ of the R slopes.

FIG. 7 illustrates a particular embodiment of the TASM encoder for the special case of a (7,4) code. In this particular embodiment, all registers initially are cleared so that a 0 is in each cell. Data are then stored in the four data row registers, $d_1$, $d_2$, $d_3$, and $d_4$. Parity-check bits are stored in parity rows $r_1$, $r_2$, and $r_3$. For this particular embodiment, parity rows $r_1$, $r_2$, and $r_3$ have corresponding parity lines with slopes 1/7, 1/2, and 1, respectively. All parity registers are cleared until a parity-check bit is stored in a particular register The first parity-check bit is calculated as follows:

$$S_{10} = \sum_{i=1}^{6} S_{1i}$$

where the sum is modulo 2.

The second parity-check bit, $S_{20}$ is calculated $$S_{20} = \sum_{i=1}^{6} S_{2i}$$

where the sum is modulo 2.

The third parity-check bit, $S_{30}$ is calculated $$S_{30} = \sum_{i=1}^{6} S_{3i}$$

where the sum is modulo 2.

At each clock pulse, four data bits, $d_1$, $d_2$, $d_3$, and $d_4$ are entered into the register and seven encoded bits are shifted out: $S_{31}$, $S_{32}$, $S_{33}$, $S_{34}$, $S_{35}$, $S_{36}$. These bits are outputted and transmitted when the last data bits clear the register.

The decoding algorithm for the TASM encoder is similar to that for the PASM encoder, described supra.

In general, the TASM encoder can be designed using K data rows and R parity rows. The first parity row uses the slope $L_1 = 1/m_1$; the second parity row uses the slope $L_2 = 1/m_2$, etc., where $L_1 < L_2, \ldots < L_{R_{max}}$. Typically, $L_{R_{max}} = 1$ to ensure compactness, and $L_1$, $L_2, \ldots, L_{Rmax}$ are chosen using the construction described for the choices in the PASM encoder.

The TASM encoder can be implemented with shift registers or RAMs or any other memory device. Preferably a memory device will comprise $K+R$ rows of memory cells, as illustrated in FIG. 7. Initially, each memory cell {column, row} is cleared; i.e., a bit $b(c,r)=0$, is set into each cell. Data are entered into the K cells in column zero. Parity-check bit $S_{10}$ is first calculated, then parity-check bit $S_{20}$ is calculated and finally parity-check bit $S_{R0}$ is calculated. The entire contents of the register are shifted left and a second column of K data bits are entered in the registers. Accordingly, parity-check bits $S_{10}, S_{20}, \ldots, S_{R0}$ are calculated, shifted left, and the process is repeated.

The equations used to calculate parity-check bits $S_{10}, S_{20}, S_{30}, \ldots, S_{R0}$, and an arbitrary parity-check bit $S_{p0}$, where $1 \leq p \leq R$, are given below. Here $S_{10}$ is calculated for slope $L_1 = 1/m_1$ and $S_{p0}$ for slope $L_p = 1/m_p$. All of the following additions are modulo 2.

$$S_{10} = \sum_{r=1, r\neq k+1}^{K+R} b\{(r-1)m_1, r\}$$

$$S_{20} = \sum_{r=1, r\neq k+2}^{K+R} b\{(r-K-1)m_2 + Km_1, r\}$$

$$S_{30} = \sum_{r=1, r\neq k+3}^{K+R} b\{(r-K-2)m_3 + m_2 + Km_1, r\}$$

$$S_{p0} = \sum_{r=1, r\neq k+p=2,\ldots,R}^{K+R} b\{(r-K-p+1)m_{p-1} + m_2 + Km_1, r\}$$

The minimum length of each register depends on the R slopes employed. For row one, for example, the register length (RL) is $$RL_1 = (2-K-R)m_R + m_{R-1} + m_{R-2} + \ldots + m_2 + m_1.$$

For row r the length is $$RL_R = (r-K-R+1)m_R + m_{R-1} + \ldots + m_2 + (K-r+1)m_1.$$

where $r=1, 2, \ldots, K+R$.

An alternate procedure for storing and encoding data is to store the entire data block to be transmitted, encoded $S_{10}, S_{20}, \ldots, S_{R0}$, as shown in FIG. 7, then calculate a second $S_{10}$, called $S_{10}(2)$, in cell $(Km_1-1, K+1)$, a second $S_{20}$, called $S_{20}(2)$, in cell $(m_2+Km_1-1, K+2)$, etc. This process is repeated until all data bits are encoded. This latter technique requires more memory than the preferred encoding procedure.

Augmentation by Zeros

Referring to Equation 7, there are values of $$a_{m,n} \qquad (8)$$

which are nonexistent. Whenever such a nonexistent data bit is required, it is assumed to be a 0-bit. Assuming such data bits to be a 1-bit does not alter the spirit of the present invention but merely its implementation. Conceptually, one can imagine that the data block shown in FIGS. A and 2B has 0-bits in all columns to the left and to the right of the data block. These 0-bits are not transmitted and therefore do not affect the code rate.

Concatenation

The PASM and TASM error correcting and detecting code can be concatenated with any other code. One preferred approach is to form a codeword using each row or by using each column. However, diagonal codewords can also be used.

For example, if the PASM and TASM error correcting and detecting code is constructed using rows containing m=11 bits, then by adding the appropriate 5 additional bits to each row forms an extended Hamming code on each row. The Hamming code can correct a single error per row and detect up to 4 errors.

In such a receiver, the Hamming code is first decoded. The resulting PASM and TASM error correcting and detecting code encoded word now has been partially corrected and where not corrected we know, with high probability, in which rows errors exist.

PASM and TASM Encoding Apparatus

Figure 9:
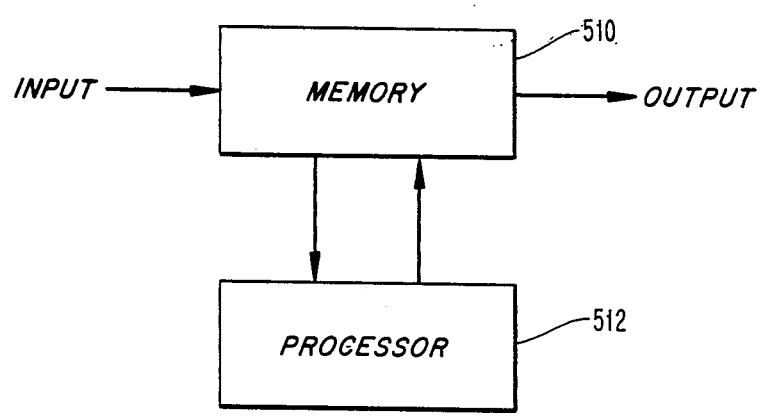
FIG. 9 shows a block diagram of the PASM and TASM encoding apparatus according to the present invention.

The present invention further includes an apparatus for encoding a PASM forward error correcting and detecting code, comprising memory means, which, as shown in FIG. 9, may be embodied as memory 510, having g rows by h columns of information-memory cells and r rows of parity-check memory cells, coupled to a data source for storing a block of a data-symbol sequence, and processor means coupled to the memory means for calculating parity-check symbols. The processor means may be embodied as a processor 512. The processor calculates a first set of parity-check symbols from the data symbols along a first set of parity lines, wherein each parity line of the first set of parity lines has a path with a first slope traversing through the information-memory cells. The first set of parity-check symbols forms a first parity row located in the parity-check memory cells. The processor means further calculates at least a second set of parity-check symbols from the data symbols along a second set of parity lines, wherein each parity line of the second set of parity lines has a path with a second slope traversing through the information-memory cells and through the first parity row. The second parity-check symbol forms a second parity row located in the parity-check memory cells. The processor means further outputs an encoded-data-symbol sequence comprising the data-symbol sequence and the parity-check symbols.

The present invention also includes a TASM error correcting and detecting code encoding apparatus comprising memory means coupled to a data source for storing a block of a data-symbol sequence having data symbols with p-bits per symbol, and processor means. The memory means, which, as shown in FIG. 9, may be embodied as memory 510 includes information memory cells and parity-check memory cells. The processor means, which, as shown in FIG. 9, may be embodied as processor 512 calculates a first parity-check symbol from data symbols located in the information memory cells, along a first parity path having a first slope passing through the information memory cells and parity-check memory cells by adding modulo $2^p$ the data symbols and parity-check symbols along the first parity path; and stores the first set of parity-check symbols in a first parity row located in the parity-check memory cells. The processor means further calculates at least a second parity-check symbol from data symbols and parity-check symbols located in the information memory cells and parity-check memory cells, respectively, along a second parity path having a second slope by adding modulo $2^p$ the data symbols and parity-check symbols along the second parity path. The second parity path traverses through the first parity-check symbol. Thus, the second parity-check symbol is located at the second slope with reference to the first parity-check symbol, in a second parity row located in the parity-check memory cells. The processor means stores the second parity-check symbol in the second parity row, and outputs an encoded-data-symbol sequence comprising the data-symbol sequence and the parity-check sequence.

Encoding in an ARO System

Consider communicating using the PASM and TASM error correcting and detecting code when a feedback channel is available. If errors are detected and are too numerous to be corrected, the feedback channel is used to notify the encoder. The encoder then sends one or more additional rows of parity check bits which significantly increases the power of the code.

In any ARQ system the probability of an undetected error is of extreme importance. Here, if each parity line checks the data only, then the probability of an undetected error, $P_{und}$, is $$P_{und} \alpha p^{4-1}$$

where p is the probability of a bit being in error and r is the number of different sloped parity lines. If each sloped line checks all data and the previously evaluated parity lines, then $P_{und}$ decreases dramatically, so that $$P_{und} \alpha p^{2r}$$

Using this system, the average code rate remains high and only those messages which were initially received incorrectly, need have additional parity check bits sent.

In this system a block of data $D_1$ is encoded with r parity lines. For example, let r=12. The block of data $D_1$ is transmitted with $r_{11} < r$ parity lines. For example, let $r_{11} = 4$. At the receiver, error correction occurs. If the errors are all corrected, the data is outputted. If some errors are not correctable, the received data block $D_1$ and the associated $r_1$ parity lines are stored. A retransmit request is returned to the sender.

Depending on system delays a data block $D_2$ is sent with $r_{22}$ parity lines and $r_{21}$ parity lines which came from the block of data $D_1$ and which was stored in memory. If $r_{11} = 4$ and $r_{21} = 4$, then at the receiver the FEC code decodes data block $D_1$ now using $r_{11} + r_{21}$ parity lines. For example, if $r_{11} = 4$, then the probability of a bit error in $D_1$ after the first decoding is of the order $p_1 \alpha p^2$, while since $r_{11} + r_{21} = 8$, the probability of a bit error in $D_2$ after the second decoding is $p_2 \alpha p^9$.

This technique is more efficient than other ARQ systems since only a new set of parity-check bits are retransmitted, while other techniques retransmit the entire data block. Also, the power of the code increases as the sum of the number of parity lines received. Other codes do not have this capability.

The encoder apparatus and procedures described above used parity check lines to modulo $2^p$ add the data symbols along each parity line. It is within the spirit of this invention to have an encoding procedure for summing data symbols along parity lines having a first slope, then sum the data symbols and the first parity-check symbols along parity lines having a second slope, sum data symbols and the parity-check symbols along parity lines having a third slope, etc. The first, second, third, . . . , $r^{th}$ slopes can be chosen arbitrarily. The decoding method and apparatus for this extension of encoding remains unchanged from the S&M code, i.e., to select the symbol with the largest number of errors exceeding the threshold and changing the symbol so as to minimize the errors.

The invention described above is a special case of a 2-dimensional array. It is within the spirit of the present invention that a 3-dimensional array of data symbols can be formed and parity check symbols obtained in the encoder. The decoder method and apparatus would operate the same as described above. Further, it is within the spirit of the present invention that a $\lambda$-dimensional array of data symbols be formed and the same encoding and decoding procedures be employed. In this more general case, there would be sufficient rows and columns to correspond to the $\lambda$-dimensional system. Further, parity-check symbols can be calculated from parity-line symbols along parity lines having curved paths passing through the $\lambda$-dimensional system.

The PASM and TASM codes are very efficient burst detecting and correcting codes. They meet the Reiger bound. However, the PASM and TASM error correcting and detecting codes can correct more random errors per codeword than the Reed-Solomon code and is easier to implement. Thus, the PASM and TASM error correcting and detecting codes are more powerful and less complex than the other competitive code.

It will be apparent to those skilled in the art that various modifications can be made to the PASM and TASM forward error correction and detection code method and apparatus of the instant invention without departing from the scope or spirit of the invention, and it is intended that the present invention cover modifications and variations of the PASM and TASM forward error correction and detection code method and apparatus provided they come within the scope of the appended claims and their equivalents.

We claim:

1. A process for encoding a PASM error correcting and detecting code comprising the steps of:
   storing a block of a data-symbol sequence having data symbols with p-bits per symbol, in memory means having information-memory cells and parity-check memory cells;
   calculating a first set of parity-check symbols from the data symbols along a first set of parity lines, by setting the parity-check symbol for each parity line of the first set of parity-check symbols for each parity line equal to the modulo-$2^p$ sum of the data symbols along each parity line, wherein each parity line of the first set of parity lines has a path with a first slope traversing through said information-memory cells, and said first set of parity-check symbols forms a first parity row located in said parity-check memory cells;

calculating at least a second set of parity-check symbols from the data symbols and parity-check symbols along a second set of parity lines, by setting the parity-check symbol for each of the second set of parity-check symbols for each parity line equal to the modulo-$2^p$ sum of the data symbols and parity-check symbols along each parity line, wherein each parity line of the second set of parity lines has a path with a second slope traversing through said information-memory cells and through said first parity row, and said second set of parity-check symbols form a second parity row located in said parity-check memory cells; and outputting an encoded-data-symbol sequence comprising the data-symbol sequence and the parity-check symbols.

2. A process for encoding a PASM error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, by setting the parity-check symbol for each of the first set of parity-check symbols for each parity line equal to the modulo-$2^p$ sum of the data symbols along each parity line, wherein each parity line of the first set of parity lines has a path with a first slope traversing through said information-memory cells, and said first set of parity-check symbols forms a first parity row located in said parity-check memory cells;

calculating a second set of parity-check symbols from the data symbols and parity-check symbols along a second set of parity lines, by setting the parity-check symbol for each of the second set of parity-check symbols for each parity line equal to the modulo-$2^p$ sum of the data symbols and parity-check symbols along each parity line, wherein each parity line of the second set of parity lines has a path with a second slope traversing through said information-memory cells and through said first parity row, and said second set of parity-check symbols form a second parity row located in said parity-check memory cells;

calculating at least a third set of parity-check symbols from the data symbols and parity-check symbols along a third set of parity lines, by setting the parity-check symbol for each of the third set of parity-check symbols for each parity line equal to the modulo-$2^p$ sum of the data symbols and parity-check symbols along each parity line, wherein each parity line of the third set of parity lines has a path with a third slope traversing through said information-memory cells and through said first and second parity rows, and said third set of parity-check symbols form a third parity row located in said parity-check memory cells; and outputting an encoded-data-symbol sequence comprising the data-symbol sequence and the parity-check symbols.

3. A process for encoding a PASM error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, wherein each parity line of the first set of parity lines has a path with a first slope traversing through said information-memory cells;

calculating at least a second set of parity-check symbols from the data symbols and parity-check symbols along a second set of parity lines, wherein each parity line of the second set of parity lines has a path with a second slope traversing through said information-memory cells and through said parity-check memory cells; and outputting an encoded-data-symbol sequence comprising the data-symbol sequence and the parity-check symbols.

4. A process for encoding a PASM error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, wherein each parity line of the first set of parity lines has a path with a first slope traversing through said information-memory cells;

calculating a second set of parity-check symbols from the data symbols and parity-check symbols along a second set of parity lines, wherein each parity line of the second set of parity lines has a path with a second slope traversing through said information-memory cells and through said parity-check memory cells;

calculating at least a third set of parity-check symbols from the data symbols and parity-check symbols along a third set of parity lines, wherein each parity line of the third set of parity lines has a path with a third slope traversing through said information-memory cells and through said parity-check memory cells; and outputting an encoded-data-symbol sequence comprising the data-symbol sequence and the parity-check symbols.

5. A process for encoding a PASM error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, wherein each parity line of the first set of parity lines has a path with a first slope traversing through said information-memory cells;

storing said first set of parity-check symbols in a first parity row located in said parity-check memory cells;

calculating at least a second set of parity-check symbols from the data symbols and parity-check symbols along a second set of parity lines, wherein each parity line of the second set of parity lines has a path with a second slope traversing through said information-memory cells and through said first parity row;

storing said second set of parity-check symbols in a second parity row located in said parity-check memory cells; and outputting an encoded-data-symbol sequence comprising the data-symbol sequence and the parity-check symbols.

6. A process for encoding a PASM error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, wherein each parity line of the first set of parity lines has a path with a first slope traversing through said information-memory cells;

storing said first set of parity-check symbols in a first parity row located in said parity-check memory cells;

calculating a second set of parity-check symbols from the data symbols and parity-check symbols along a second set of parity lines, wherein each parity line of the second set of parity lines has a path with a second slope traversing through said information-memory cells and through said first parity row;

storing said second set of parity-check symbols in a second parity row located in said parity-check memory cells;

calculating at least a third set of parity-check symbols from the data symbols and parity-check symbols along a third set of parity lines, wherein each parity line of the third set of parity lines has a path with a third slope traversing through said information-memory cells and through said first and second parity rows;

storing said third set of parity-check symbols in a third parity row located in said parity-check memory cells; and outputting an encoded-data-symbol sequence comprising the data-symbol sequence and the parity-check symbols.

7. The process of encoding a PASM error correcting and detecting code as set forth in claim 1, 2, 3, 4, 5, or 6, wherein the step of storing a block of a data-symbol sequence includes storing the data-symbol sequence in g rows by h columns of information-memory cells.

8. A process for encoding a TASM error correcting and detecting code comprising the steps of:

storing a block of a data-symbol sequence having data symbols with p-bits per symbol, in memory means having information memory cells and parity-check memory cells;

calculating a first parity-check symbol from data symbols and parity-check symbols located in the information memory cells and parity-check memory cells, respectively, along a first parity path having a first slope passing through the information memory cells and parity-check memory cells by adding modulo $2^p$ the data symbols and parity-check symbols along the first parity path;

storing said first parity-check symbol in a first parity row located in said parity-check memory cells;

calculating a second parity-check symbol from data symbols and parity-check symbols located in the information memory cells and parity-check memory cells, respectively, along a second parity path having a second slope by adding modulo $2^p$ the data symbols and parity-check symbols along the second parity path, wherein said second parity path traverses through said first parity-check symbol;

storing said second parity-check symbol in said second parity row; and outputting an encoded-data-symbol sequence comprising the data-symbol sequence and the parity-check sequence.

9. A process for encoding a TASM error correcting and detecting code comprising the steps of:

storing a block of a data-symbol sequence having data symbols with p-bits per symbol, in memory means having information memory cells and parity-check memory cells;

calculating a first parity-check symbol from data symbols and parity-check symbols located in the information memory cells and parity-check memory cells, respectively, along a first parity path having a first slope passing through the information memory cells and parity-check memory cells by adding modulo $2^p$ the data symbols and parity-check symbols along the first parity path;

storing said first parity-check symbol in a first parity row located in said parity-check memory cells;

calculating a second parity-check symbols from data symbols and parity-check symbols located in the information memory cells and parity-check memory cells, respectively, along a second parity path having a second slope by adding modulo $2^p$ the data symbols and parity-check symbols along the second parity path, wherein said second parity path traverses through said first parity-check symbol;

storing said second parity-check symbol in said second parity row;

calculating at least a third parity-check symbol from data symbols and parity-check symbols located in the information memory cells and parity-check memory cells, respectively, along a third parity path having a third slope passing through the second parity-check row, and through the information memory cells and parity-check memory cells, by adding modulo $2^p$ the data symbols and parity-check symbols along the third parity path, wherein said third parity path traverses through said second parity-check symbol;

storing said third parity-check symbol in a third parity row located in said parity-memory cells; and outputting an encoded-data symbol sequence.

10. A process for encoding a TASM error correcting and detecting code comprising the steps of:

storing a block of a data-symbol sequence having data symbols with p-bits per symbol, in memory means having information memory cells and parity-check memory cells;

calculating a first parity-check symbol from data symbols and parity-check symbols located in the information memory cells and parity-check memory cells, respectively, along a first parity path having a first slope passing through the information memory cells and parity-check memory cells;

calculating at least a second parity-check symbol from data symbols and parity-check symbols located in the information memory cells and parity-check memory cells, respectively, along a second parity path having a second slope, wherein said second parity path traverses through said first parity-check symbol; and outputting an encoded-data-symbol sequence comprising the data-symbol sequence and the parity-check sequence.

11. A process for encoding a TASM error correcting and detecting code comprising the steps of:

storing a block of a data-symbol sequence having data symbols with p-bits per symbol, in memory means having information memory cells and parity-check memory cells;

calculating a first parity-check symbol from data symbols and parity-check symbols located in the information memory cells and parity-check memory cells, respectively, along a first parity path having a first slope passing through the information memory cells and parity-check memory cells;

calculating a second parity-check symbol from data symbols and parity-check symbols located in the information memory cells and parity-check memory cells, respectively, along a second parity path having a second slope, wherein said second parity path traverses through said first parity-check symbol;

calculating at least a third parity-check symbol from data symbols and parity-check symbols located in the information memory cells and parity-check memory cells, respectively, along a third parity path having a third slope passing through the second parity-check row, and through the information memory cells and parity-check memory cells, wherein said third parity path traverses through said second parity-check symbol in the second parity row; and outputting an encoded-data symbol sequence.

12. The process for encoding a TASM error correcting and detecting code as set forth in claim 8, 9, 10, or 11, wherein the step of storing a block of a data-symbol sequence includes storing the data-symbol sequence in g rows by h columns of information memory cells.

13. A process for communicating in an ARQ system with the PASM FEC and detection code comprising the steps of:

storing a block of a data-symbol sequence having data symbols with p-bits per symbol, in memory means having information-memory cells and parity-check memory cells;

calculating a first block of parity-check symbols from the data symbols along at least two sets of parity lines, wherein each parity line of the first set of parity lines has a path with a first slope, and each parity line of the second set of parity lines has a path with a second slope, traversing through said information-memory cells;

calculating at least a second block of parity-check symbols from the data symbols and parity-check symbols along at least a third set of parity lines, wherein each parity line of the third set of parity lines has a path with a third slope traversing through said information-memory cells and through said parity-check memory cells; and transmitting encoded-data-symbol sequence comprising the data-symbol sequence and the first block of parity-check symbols, over a communications channel having a feedback channel;

storing the encoded-data-symbol sequence in receiver-memory means having receiver-information-memory cells and receiver-parity-memory cells, wherein said encoded-data-symbol sequence includes a received-parity-check-symbol sequence having received-parity-check symbols stored in the receiver-parity-memory cells, and a receiver-data-symbol sequence blocked and stored in the receiver-information-memory cells;

finding the parity-check bits and the parity-line bits along the parity lines in receiver-information-memory cells, having an error;

incrementing the count of each composite cell on a composite-error graph traversed by the path of each of the parity lines having an error;

determining the largest-number cell in the composite-error graph having the largest number;

comparing the largest number to a threshold;

inverting, provided the largest number exceeds the threshold, the data bit in the receiver-information-memory cells corresponding to the largest-number cell in the composite-error graph having the largest number, thereby the new-data symbol minimizes the count in the largest-number cell;

sending a retransmit request to the transmitter if some errors are not correctable;

sending the second block of parity-check symbols over the communications channel; and using the second set of parity-check symbols, repeating the steps of finding the parity-check bits and the parity-line bits along the parity lines in the g rows by h columns of receiver-information-memory cells, having an error;

incrementing the count of each composite cell on a composite-error graph traversed by the path of each of the parity lines having an error;

determining the largest-number cell in the composite-error graph having the largest number;

comparing the largest number to a threshold;

inverting, provided the largest number exceeds the threshold, the data bit in the receiver-information-memory cells corresponding to the largest-number cell in the composite-error graph having the largest number, thereby the new-data symbol minimizes the count in the largest-number cell.

14. A PASM error correcting and detecting code encoding apparatus comprising:

memory means coupled to a data source for storing a block of a data-symbol sequence; and processor means coupled to said memory means for calculating a first set of parity-check symbols from the data symbols along a first set of parity lines, wherein each parity line of the first set of parity lines has a path with a first slope traversing through said information-memory cells, and said first set of parity-check symbols forms a first parity row located in said parity-check memory cells, calculating at least a second set of parity-check symbols from the data symbols along a second set of parity lines, wherein each parity line of the second set of parity lines has a path with a second slope traversing through said information-memory cells and through said first parity row, and said second set of parity-check symbols form a second parity row located in said parity-check memory cells, and outputting an encoded-data-symbol sequence comprising the data-symbol sequence and the parity-check symbols.

15. A TASM error correcting and detecting code encoding apparatus comprising:

memory means coupled to a data source for storing a block of a data-symbol sequence having data symbols with p-bits per symbol, in memory means having information memory cells and parity-check memory cells; and processor means for calculating a first set of parity-check symbols from data symbols located in the information memory cells, along a first parity path having a first slope passing through the information memory cells and parity-check memory cells by adding modulo $2^p$ the data symbols and parity-check symbols along the first parity path; storing said first set of parity-check symbols in a first parity row located in said parity-check memory cells; calculating at least a second set of parity-check symbols from data symbols and parity-check symbols located in the information memory cells and parity-check memory cells, respectively, along a second parity path having a second slope by adding modulo $2^p$ the data symbols and parity-check symbols along the second parity path, wherein said second parity-check symbols are located at said second slope with reference to the first parity-check symbols, in a second parity row located in said parity-check memory cells; storing said second parity-check symbols in said second parity row; and outputting an encoded-data-symbol sequence comprising the data-symbol sequence and the parity-check sequence.

* * * * *